US006762114B1

United States Patent
Chambers

(10) Patent No.: US 6,762,114 B1
(45) Date of Patent: Jul. 13, 2004

(54) METHODS FOR TRANSISTOR GATE FABRICATION AND FOR REDUCING HIGH-K GATE DIELECTRIC ROUGHNESS

(75) Inventor: James Joseph Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/335,557

(22) Filed: Dec. 31, 2002

(51) Int. Cl.$^7$ .......................................... H01L 21/3205
(52) U.S. Cl. ..................... 438/591; 438/778; 438/785
(58) Field of Search .............................. 438/591, 768, 438/778, 783, 785; 257/410; 427/255.28, 255.29, 255.37, 255.391, 255.392, 255.393, 96, 99, 328, 255.31

(56) References Cited

U.S. PATENT DOCUMENTS

| | | | | |
|---|---|---|---|---|
| 4,495,219 A | * | 1/1985 | Kato et al. ..................... 427/82 |
| 6,060,755 A | * | 5/2000 | Ma et al. ..................... 257/410 |
| 6,063,698 A | * | 5/2000 | Tseng et al. ................. 438/585 |
| 6,184,072 B1 | | 2/2001 | Kaushik et al. | |
| 6,207,584 B1 | * | 3/2001 | Shen et al. .................. 438/762 |
| 6,251,761 B1 | | 6/2001 | Rodder et al. | |
| 6,271,094 B1 | | 8/2001 | Boyd et al. | |
| 6,303,940 B1 | | 10/2001 | Kizilyalli et al. | |
| 6,320,238 B1 | | 11/2001 | Kizilyalli et al. | |
| 6,380,104 B1 | | 4/2002 | Yu | |
| 6,407,435 B1 | | 6/2002 | Ma et al. | |
| 6,444,592 B1 | | 9/2002 | Ballantine et al. | |
| 6,448,127 B1 | | 9/2002 | Xiang et al. | |
| 6,451,677 B1 | | 9/2002 | Lu et al. | |
| 6,455,330 B1 | | 9/2002 | Yao et al. | |
| 6,495,474 B1 | * | 12/2002 | Rafferty et al. ............. 438/766 |
| 6,511,925 B1 | * | 1/2003 | Aronowitz et al. ......... 438/788 |
| 6,514,828 B2 | * | 2/2003 | Ahn et al. .................. 438/297 |
| 2002/0058424 A1 | | 5/2002 | Rotondaro | |

* cited by examiner

Primary Examiner—M. Wilczewski
(74) Attorney, Agent, or Firm—Jacqueline J. Garner; W. James Brady, III; Frederick J. Telecky, Jr.

(57) ABSTRACT

Methods are disclosed for fabricating transistor gate structures in which high-k dielectric layer roughness is reduced by formation of a nucleation promotion layer over the substrate or any intentional interface layers, and a high-k gate dielectric is formed over the nucleation promotion layer. The nucleation promotion layer has a thickness of 10 Å or less, such as a monolayer or a sub-monolayer, comprising a metal, a metal silicide, or a metal silicate, which promotes uniform chemical vapor deposition of high-k gate dielectric materials by increasing the density of nucleation sites on the substrate or intentional interface layer.

18 Claims, 4 Drawing Sheets

METHODS FOR TRANSISTOR GATE FABRICATION AND FOR REDUCING HIGH-K GATE DIELECTRIC ROUGHNESS

FIELD OF INVENTION

This invention relates generally to semiconductor devices and more particularly to methods for fabricating transistor gate structures and for reducing roughness in high-k gate dielectric layers in the manufacture of semiconductor devices.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a metal or polysilicon gate contact is energized to create an electric field in a channel region of a semiconductor body, by which current is allowed to conduct between a source region and a drain region of the semiconductor body. The source and drain regions are typically formed by adding dopants to targeted regions on either side of the channel region in a semiconductor substrate. A gate dielectric or gate oxide, such as silicon dioxide ($SiO_2$), is formed over the channel region, typically by thermal oxidation. A gate electrode or gate contact (e.g., metal or doped polysilicon) is then formed over the gate dielectric, and the gate dielectric and gate contact materials are patterned to form a gate structure overlying the channel region of the substrate.

The gate dielectric is an insulator material, which prevents large currents from flowing from the gate into the channel when a voltage is applied to the gate contact, while allowing such an applied gate voltage to set up an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface.

However, there are electrical and physical limitations on the extent to which thickness of gate dielectrics formed of $SiO_2$ can be reduced. For example, very thin $SiO_2$ gate dielectrics are prone to large gate tunneling leakage currents resulting from direct tunneling through the thin gate oxide when a gate voltage is applied. In addition, there are conventional limitations on the ability to form such thin oxide films with uniform thickness. Furthermore, thin $SiO_2$ gate dielectric layers provide a poor diffusion barrier to impurities, for example, and may allow high boron dopant penetration into the underlying channel region of the silicon during fabrication of the source/drain regions.

To address these shortcomings and limitations, recent efforts directed to MOS device scaling have focused on alternative dielectric materials which can be formed in a thicker layer than scaled $SiO_2$, and yet which produce equivalent field effect performance. These materials generally have a dielectric constant "k" greater than that of $SiO_2$, and are commonly referred to as high-k materials or high-k dielectrics. The relative performance of these high-k materials is often expressed as equivalent oxide thickness (EOT), because the alternative material layer may be thicker, while still providing the equivalent electrical effect of a much thinner layer of $SiO_2$. Because the dielectric constant is higher, a thicker high-k dielectric layer can be deposited to avoid or mitigate tunneling leakage currents, while still achieving the required value of EOT that is comparable to the EOT value of a thinner layer of thermally grown $SiO_2$. The reduction in transistor gate equivalent oxide thickness is sometimes referred to as EOT scaling.

High-k dielectrics are typically deposited directly over a silicon substrate to form a gate dielectric layer using chemical vapor deposition (CVD), atomic layer CVD(AL-CVD), plasma enhanced CVD (PECVD) or physical vapor deposition (PVD) processes such as sputtering. One shortcoming in forming high-k gate dielectric films using conventional CVD processes is rough surface morphology, leading to limitations of the ability to implement EOT scaling and degradation of device performance. In particular, roughness in the upper surface of the high-k dielectric layer in a transistor gate impedes EOT scaling efforts because the film appears electrically thicker in some locations and thinner in others. In this regard, thin portions of the resulting gate dielectric suffer from higher leakage currents than thicker portions, while the thicker portions have higher EOT than the thinner portions. As the high-k film thickness is scaled down, the upper surface roughness becomes more significant, whereby effective limitations arise in the ability to further scale the dielectric. Therefore, there is a need for improved gate fabrication techniques by which roughness in CVD deposited high-k dielectrics films may be reduced.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for fabricating transistor gate structures and high-k dielectric layers therefor using CVD deposition processes, while reducing or avoiding the undesirable effects of high-k dielectric roughness, by which improved device performance and scalability may be achieved.

In one aspect of the invention, methods are provided for fabricating transistor gate structures, in which a nucleation promotion layer is formed over a substrate or other semiconductor body. The nucleation promotion layer comprises a metal, metal silicide, or a metal silicate, which increases the density of nucleation sites on the substrate surface. During subsequent CVD deposition of high-k gate dielectric material, the high density of nucleation sites promotes uniform formation of high-k dielectric material on the substrate with reduced roughness at the top surface of the high-k layer. The nucleation promotion layer thus facilitates EOT scaling, gate leakage current reduction, and increased device reliability through improved uniformity in electrical and material properties.

The nucleation promotion layer may be formed using CVD, PVD or other deposition processes. In one possible implementation, the nucleation promotion layer and the high-k dielectric layer are both formed in-situ in a single chemical vapor deposition process chamber. The nucleation promotion layer, moreover, may be a very thin film, such as about 10 Å or less in thickness, preferably a monolayer or sub-monolayer. In addition, where the high-k dielectric layer is a compound material comprising a metal such as hafnium, the nucleation promotion layer may advantageously comprises the same metal, a silicide of the metal, or a silicate of the metal, so as to facilitate nucleation in the initial stages of high-k CVD deposition.

Another aspect of the invention provides methods for fabricating a transistor gate structure, which comprises forming an intentional interface layer over the semiconductor body, and forming a nucleation promotion layer over the intentional interface layer. Thereafter, a high-k dielectric layer is formed over the nucleation promotion layer using a chemical vapor deposition process. The nucleation promotion layer overlying the intentional interface layer provides an increased number of nucleation sites for deposition of high-k material on the intentional interface, thereby promoting uniform formation of high-k dielectric material without the degree of upper surface roughness found in conventional CVD processes. Yet another aspect of the invention provides methods for reducing high-k gate dielectric roughness in the fabrication of a transistor gate structure, comprising forming a nucleation promotion layer over a semiconductor body or an intentional interface layer, where the nucleation promotion layer comprising a metal, a metal silicide, or a metal silicate. The method further comprises forming a high-k dielectric layer over the nucleation promotion layer using a chemical vapor deposition process.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
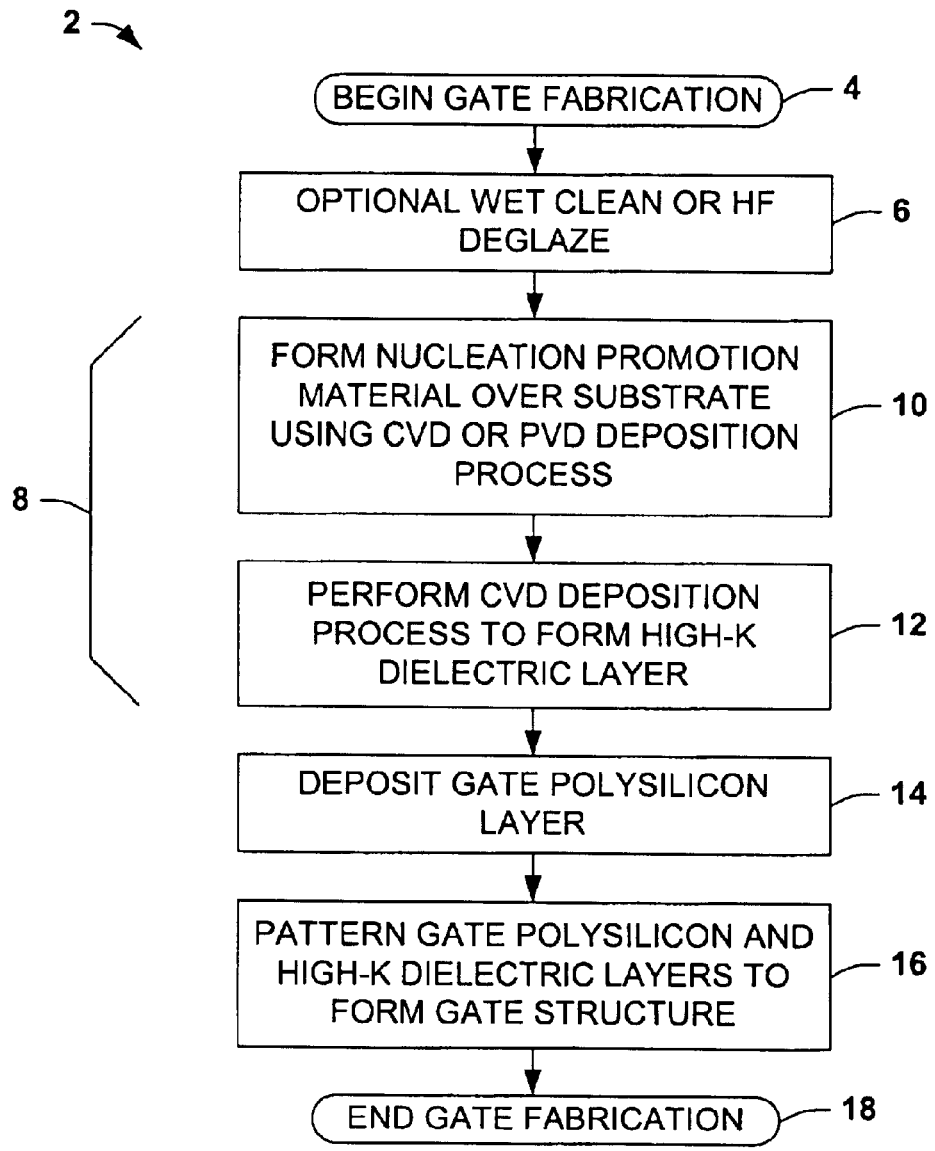
FIG. 1 is a flow diagram illustrating an exemplary method of fabricating transistor gate structures including formation of a nucleation promotion layer over a substrate or other semiconductor body prior to CVD deposition of high-k materials in accordance with one or more aspects of the present invention.

One or more implementations of the present invention will now be described with reference to the attached drawings, wherein like reference numerals are used to refer to like elements throughout. The invention relates to methods for fabricating gate structures in a semiconductor device, which may be employed in association with any type of semiconductor body, including silicon or other semiconductor substrates, as well as silicon or other semiconductor layers overlying an insulator region or layer in an SOI device.

The inventors have appreciated that mobility, scalability, and other performance and issues are negatively impacted by roughness at the top surface of a gate dielectric layer, which may occur during CVD deposition of high-k dielectric materials in the manufacture of transistor devices. Although not wishing to be tied to any particular theory, these problems are believed to be primarily the result of low nucleation site density on the surface of a semiconductor body or intentional interface layer during initial stages of CVD deposition. As a precursor molecule or atom approaches the surface, it is believed to land on the surface, and may move around on the surface until it finds the lowest energy site. Subsequently, other precursor molecules approaching the surface near the first precursor molecule will preferentially adhere to the substrate near the first precursor, thereby forming an island of high-k material. Islands of high-k materials form in like manner at different locations, which are spatially separated from one another.

These growth sites or islands eventually coalesce as the CVD process continues. However, where the initial nucleation sites are widely dispersed on the surface of the substrate or intentional interface layer due to a low density of nucleation sites in silicon or many intentional interface layers (e.g., $SiO_2$ or others), the growth sites do not coalesce to form a cohesive film until relatively late in the process. At this point, the high-k material may be several molecule thicknesses at some locations, but only one molecule thickness at the recently joined locations. Where the finished high-k dielectric layer is relatively thin, the deposition process is fairly short, in which case the thickness variation or roughness is present in the top surface of the finished high-k layer. This roughness has been found to be on the order of one or two monolayers or around 3–10 Å in a high-k layer of about 30 Å thickness, because of which the leakage current reduction advantages of using high-k films may not be fully attainable.

The present invention provides more low energy nucleation sites across the wafer or intentional interface layer, by formation of a nucleation promotion layer to create more uniformity in attracting precursor molecules during subsequent chemical vapor deposition of high-k materials. While not wishing to be tied to any particular theory, it is believed that formation of a thin layer of metal, metal silicide, or metal silicate increases the number of locations or sites where the growth of high-k material begins in a chemical vapor deposition process. Further, it is believed that the closer these initial nucleation sites are, the more likely the high-k deposition will occur through layer-by-layer growth or that the islands of high-k will coalesce to form a cohesive film early in the deposition process, by which variations in the finished high-k layer thickness are reduced or avoided.

Referring initially to FIG. 1, an exemplary method 2 is illustrated for fabricating a transistor gate structure in accordance with one or more aspects of the present invention. The methods of the current invention involve the formation of a nucleation promotion layer on a semiconductor body or interface layer in order to enhance nucleation site density and thereby reduce surface roughness or non-uniformity in high-k dielectric material deposited over the nucleation promotion layer. Although the exemplary method 2 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication and/or processing of the transistor gate structures and high-k dielectric films therefor which are illustrated and described herein as well as in association with other structures and films not illustrated.

Gate fabrication in the method 2 begins at 4, where a wet clean or HF deglaze operation may optionally be performed at 6 to remove any thin dielectric layers from the semiconductor body, such as silicon oxide (SiO), silicon nitride (SiN), or silicon oxynitride (SiON). For removing SiO, wet cleaning operations can be performed at 6, or a dilute HF solution may be employed to deglaze the semiconductor body. One example of such an HF deglaze involves dipping the semiconductor in a 1:100 volume dilution of 49% HF at room temperature for a duration that is adequate to completely remove any SiO from the surface. In another example, a dry process is employed comprising a mixture of anhydrous HF and isopropyl-alcohol to remove SiO.

A gate dielectric is then processed at 8, including forming a nucleation promotion layer over the semiconductor body at 10, where the nucleation promotion layer comprises a metal, a metal silicide, or a metal silicate. The nucleation promotion layer may be formed at 10 using any appropriate material deposition technique, such as PVD, CVD, or others. Thereafter, a high-k dielectric layer is formed at 12 over the nucleation promotion layer using a chemical vapor deposition process. The invention may be employed in association with CVD deposition of any high-k dielectric layer material at 12 to any desired thickness, such as 10–100 Å, for example 20–25 Å, where the nucleation promotion layer may be formed at 10 over a silicon or other semiconductor substrate or any type of semiconductor body. In one example, the high-k dielectric layer comprises a high-k oxide, oxynitride, or nitride, such as hafnium oxide ($HfO_2$), hafnium oxynitride (HfON), hafnium silicon oxynitride (HfSiON) or others. However, the invention is not limited to these materials.

High-k materials which may be deposited in association with the present invention may include, but are not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YsiON etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate as are known in the art.

A gate contact layer, such as metal, polysilicon, or equivalent, is then deposited at 14 over the high-k dielectric layer, and the gate contact layer and the high-k dielectric layer are patterned using any appropriate photolithographic techniques (e.g., patterned etching, etc.) at 16 to form a gate structure, before the gate fabrication method 2 ends at 18.

The method 2 facilitates reduction in the amount of roughness at the upper surface of the high-k dielectric material, which in turn facilitates EOT scaling, gate leakage current reduction, and increased device reliability through improved uniformity in electrical and material properties.

The nucleation promotion layer formed at 10 may comprise any metal, metal silicate, or metal silicide in accordance with the present invention. In one implementation, where the high-k dielectric layer is a compound material comprising a metal, the nucleation promotion layer preferably comprises the metal, a silicide of the metal, or a silicate of the metal. For example, in the case where the high-k dielectric layer comprises a high-k oxide, oxynitride, or nitride, such as hafnium oxide ($HfO_2$), hafnium oxynitride (HfON), or hafnium silicon oxynitride (HfSiON), etc., the nucleation promotion layer preferably comprises hafnium, a silicide of hafnium, or a silicate of hafnium. In this aspect of the invention, the employment of the same metal constituent in the nucleation promotion and high-k dielectric layers is believed to further enhance uniform nucleation of high-k precursor molecules, particularly in the initial stages of CVD deposition at 12, whereby upper surface roughness is reduced in the deposited high-k dielectric layer.

The nucleation promotion layer, moreover, is preferably thin, such as having a thickness of about 10 Å or less. In one implementation, the nucleation promotion layer formed at 10 is a monolayer, for example, having an average thickness on the order of one or a few Å. In another preferred implementation, the nucleation promotion layer is a sub-monolayer. In this regard, a sub-monolayer need not cover the entire surface of the semiconductor body. Although the sub-monolayer implementation does not provide nucleation promoting metal, metal silicide, or metal silicate over every portion of the semiconductor surface, the provision of some such molecules on the semiconductor body surface at 10 increases the nucleation site density and hence advantageously improves the nucleation of high-k material in the subsequent CVD high-k deposition at 12.

As discussed above, moreover, the nucleation promotion layer may be formed at 10 using any appropriate material deposition technique, such as PVD, CVD, or others. In one implementation, the nucleation promotion layer and the high-k dielectric layer are both formed by CVD processing in-situ in a single chemical vapor deposition process chamber at 10 and 12. For a CVD case, process pressures in the range of single digit mTorr up to tens of Torr may be employed, with lower pressure being preferable to facilitate control of the deposited material flux to the surface. One example is performed in an inert environment or an oxidizing environment (e.g., Ar or Ar with O), and other implementations employ a reducing environment, such as hydrogen, ammonia, etc. In the in-situ case, a first step may employ essentially the same or similar process conditions at 10 as used for the bulk high-k deposition process at 12, but including only a hafnium precursor, for example, at 10. In this case, the process step at 10 may be continued to form a sub-monolayer, monolayer, or a thin film. Thereafter at 12, a reducing or an oxidizing ambient may be provided (e.g., by co-flowing appropriate hydrogen, ammonia, oxygen, etc.) to clean away all the ligands present on the precursor.

In either CVD or PVD nucleation promotion layer formation, another possible approach involves two process chambers or tools, such as performing a PVD first step to deposit a thin metal, metal silicide, or metal silicate nucleation promotion layer on the wafer at 10, and then transferring the wafer into a CVD chamber for high-k deposition at 12. In one implementation, the nucleation promotion layer is formed by PVD sputter processing at 10 using process pressures in the mTorr range using relatively low RF power, such as less than 100 W across an 8 inch wafer (e.g., power density of about 324 W/cm$^2$ or less) using an Ar process gas for sputtering a hafnium target.

Figure 2:
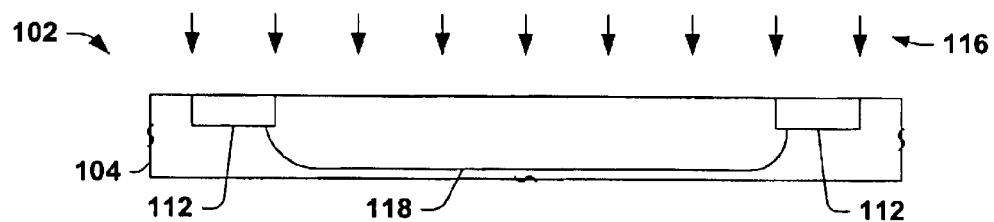
FIGS. 2–6 are partial side elevation views in section illustrating an exemplary semiconductor device being processed at various stages of manufacturing in accordance with various aspects of the invention.

Referring now to FIGS. 2–6, an exemplary semiconductor device 102 is illustrated undergoing processing at various stages of manufacturing in accordance with various aspects of the invention, wherein the structures illustrated herein are not necessarily drawn to scale. In FIG. 2, the device 102 is illustrated comprising a wafer having a semiconductor body 104 therein, such as a silicon substrate or a layer of silicon overlying an insulator in an SOI device wafer, wherein the exemplary semiconductor body 104 is a lightly doped p-type silicon substrate. STI isolation structures 112 (e.g., $SiO_2$) are formed in the body 104 via an isolation process 114, which separate and provide electrical isolation between active areas, although other isolation structures may be provided, for example, using LOCOS techniques as are known. One or more p and/or n-type wells are then formed in the semiconductor body 104, including an n-well 118, and an optional wet clean or HF deglaze operation 116 may be performed to clean the top surface of the semiconductor body 104. As discussed further below with respect to FIG. 7, an intentional interface layer (not shown) may optionally be formed over the semiconductor body 104 via any appropriate process steps before nucleation layer deposition.

Figure 3:
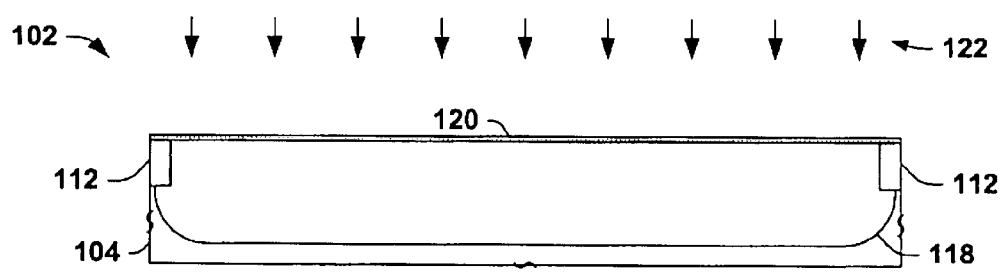
Figure 4:
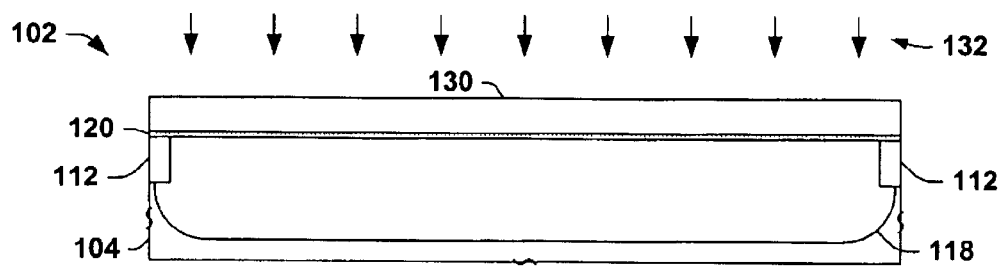

In FIG. 3, a PVD, CVD or other deposition process 122 is performed to deposit a thin nucleation promotion layer 120 comprising a metal, a metal silicide, or a metal silicate over all or a portion of the upper surface of the semiconductor body 104 (e.g., or over any intentional interface layer or layers, not shown). In the illustrated example, the nucleation promotion layer 120 is a thin hafnium film with a thickness less than about 10 Å. Other examples include formation of a nucleation promotion monolayer 120, for example, having an average thickness on the order of one or a few Å. In another preferred implementation, the nucleation promotion layer 120 is a sub-monolayer, which need not cover the entire surface of the semiconductor body 104. In FIG. 4, a high-k dielectric layer 130 is deposited over the nucleation promotion layer 120 via a CVD deposition process 132 as described above, wherein the processes 122 and 132 may, but need not, be performed in-situ in a single CVD process chamber or tool. The high-k dielectric layer 130 comprises any appropriate high-k dielectric material, such as those mentioned above, formed to any desired thickness, such as 10–100 Å, for example 20–25 Å.

Figure 5:
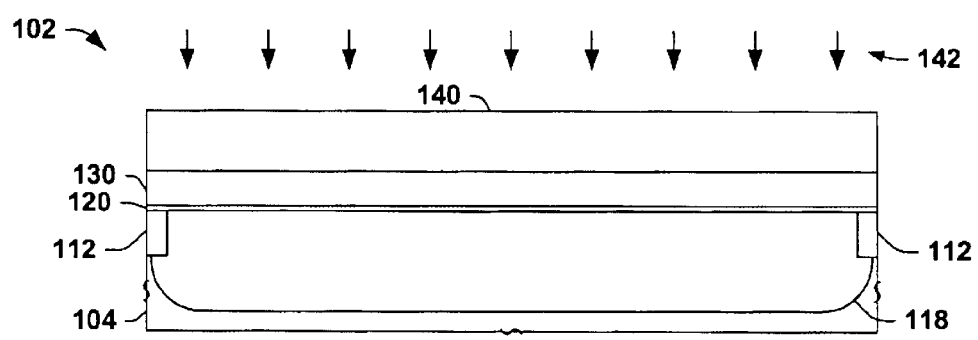
Figure 6:
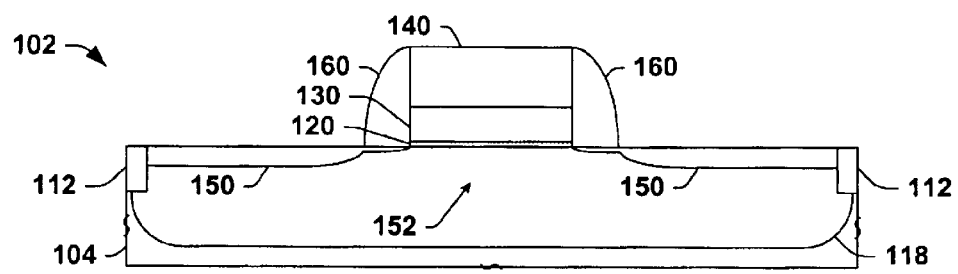

In FIG. 5, a gate contact layer 140, such as metal, polysilicon or equivalent is deposited over the high-k material 130 via a deposition process 142. As illustrated in FIG. 5, the gate contact layer 140 and the high-k dielectric layer 130 are then patterned to form a transistor gate structure. Source/drain regions 150 are doped with p-type impurities on either side of a channel region 152 in the semiconductor body 104, and sidewall spacers 160 are formed along the sides of the patterned layers 120, 130, and 140 as illustrated in FIG. 8. Thereafter, interconnect processing (not shown) is performed to interconnect the illustrated MOS type transistor and other electrical components in the device 102.

Figure 7:
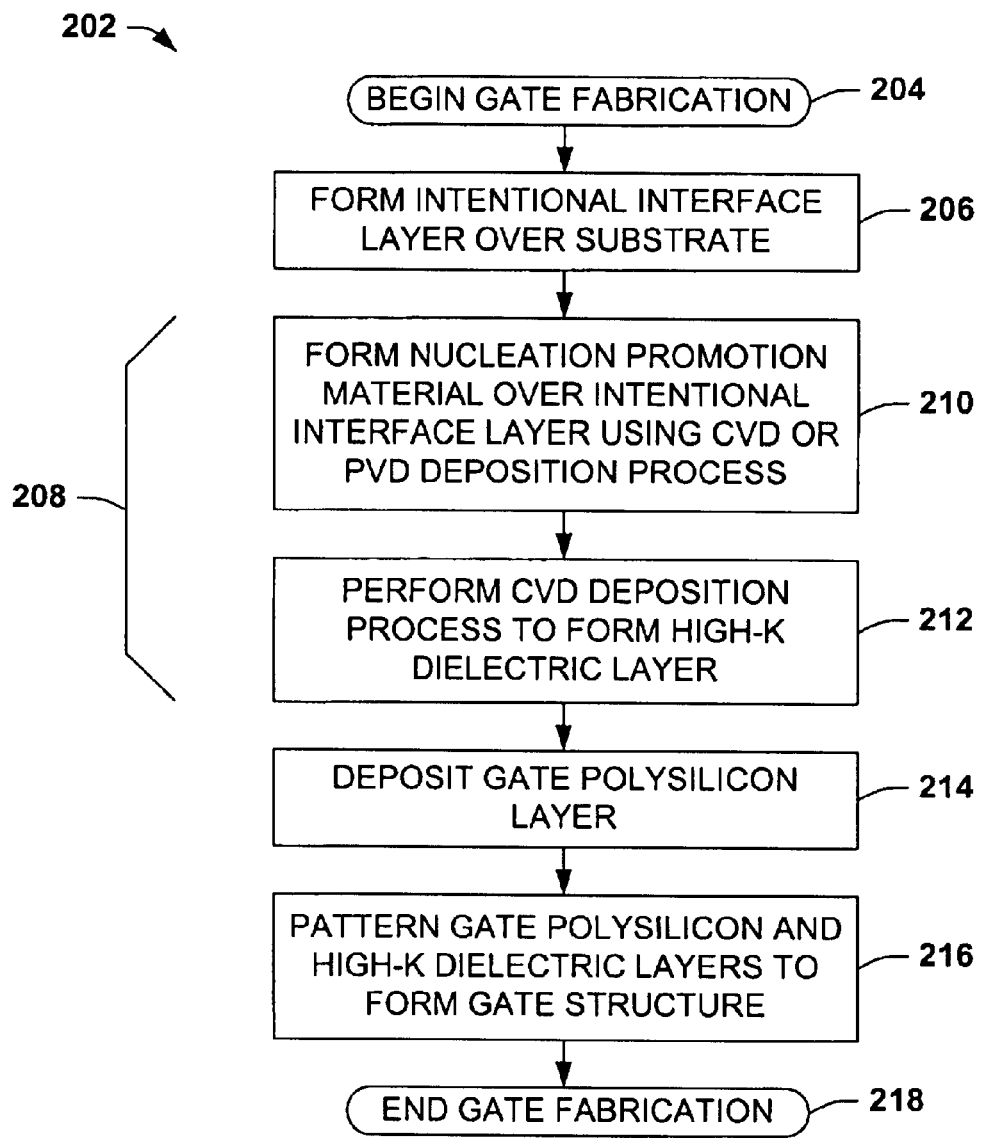
FIG. 7 is a flow diagram illustrating another exemplary method of fabricating transistor gate structures including formation of a nucleation promotion layer over an intentional interface layer before CVD deposition of high-k materials in accordance with one or more aspects of the present invention.

Referring now to FIG. 7, another aspect of the invention provides methods for fabricating a transistor gate structure, in which an intentional interface layer is formed over the semiconductor body, and a nucleation promotion layer is formed over the intentional interface layer prior to deposition of high-k gate dielectric material. The inventors have appreciated that forming a nucleation promotion layer over the intentional interface layer provides an increased number or higher density of nucleation sites for deposition of high-k material, thereby promoting uniform formation of high-k dielectric material without the degree of upper surface roughness found in conventional CVD processes. An exemplary method 202 is illustrated in FIG. 7 in accordance with this aspect of the invention.

Beginning at 204, an intentional interface layer is formed at 206 over a substrate or other semiconductor body, using any appropriate materials and deposition or thermal growth techniques as are known. Moreover, the intentional interface may be formed to any desired thickness at 206 in accordance with the present invention. A gate dielectric is then created at 208 by forming a nucleation promotion layer over the semiconductor body at 210 and depositing high-k material using a CVD deposition process at 212. As with the above implementations, the nucleation promotion layer formed comprises a metal, a metal silicide, or a metal silicate, which may be formed at 210 using any appropriate material deposition technique, such as PVD, CVD, or others. This aspect of the invention may be employed in association with CVD deposition of any high-k dielectric layer material at 212 to any desired thickness, such as 10–100 Å, for example 20–25 Å, over the nucleation promotion layer. In one example, the high-k dielectric layer comprises a high-k oxide, oxynitride, or nitride, such as hafnium oxide ($HfO_2$), hafnium oxynitride (HfON), hafnium silicon oxynitride (HfSiON) or others, although any of the above-mentioned high-k materials may be employed at 212.

A gate contact layer, such as metal, polysilicon, or equivalent, is then deposited at 214 over the high-k dielectric layer, and the gate contact layer and the high-k dielectric layer are patterned using any appropriate photolithographic techniques at 216 to form a gate structure, before the gate fabrication method 202 ends at 218. Like the above techniques, the exemplary method 202 facilitates reduction in the amount of roughness at the upper surface of the high-k dielectric material, which in turn facilitates EOT scaling, gate leakage current reduction, and increased device reliability through improved uniformity in electrical and material properties.

The nucleation promotion layer formed at 210 may comprise any metal, metal silicate, or metal silicide in accordance with the present invention. In one implementation, where the high-k dielectric layer is a compound material comprising a metal, the nucleation promotion layer preferably comprises the same metal, a silicide of the metal, or a silicate of the metal. For example, in the case where the high-k dielectric layer comprises a high-k oxide, oxynitride, or nitride, such as hafnium oxide ($HfO_2$), hafnium oxynitride (HfON), or hafnium silicon oxynitride (HfSiON), etc., the nucleation promotion layer preferably comprises hafnium, a silicide of hafnium, or a silicate of hafnium. In addition, the nucleation promotion layer is preferably thin, such as having a thickness of about 10 Å or less. In one implementation, the nucleation promotion layer formed at 210 is a monolayer, for example, having an average thickness on the order of one or a few Å. In another preferred implementation, the nucleation promotion layer is a sub-monolayer. Furthermore, the nucleation promotion layer may be formed at 210 using any appropriate material deposition technique, such as PVD, CVD, or others. In one implementation, the nucleation promotion layer and the high-k dielectric layer are formed at 210 and 212 by CVD processing in-situ in a single chemical vapor deposition process chamber, such as using the process conditions described above.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a transistor gate structure, comprising:
   forming a nucleation promotion layer over a semiconductor body, the nucleation promotion layer comprising a metal, a metal silicide, or a metal silicate;
   forming a high-k dielectric layer over the nucleation promotion layer using a chemical vapor deposition process;
   forming a gate contact layer over the high-k dielectric layer; and
   patterning the gate contact layer and the high-k dielectric layer.

2. The method of claim 1, wherein forming the nucleation promotion layer and forming the high-k dielectric layer are performed in-situ in a single chemical vapor deposition process chamber.

3. The method of claim 1, wherein forming the nucleation promotion layer comprises performing one of a chemical vapor deposition process and a physical vapor deposition process.

4. The method of claim 1, wherein the nucleation promotion layer has a thickness of about 10 Å or less.

5. The method of claim 4, wherein the nucleation promotion layer is a monolayer.

6. The method of claim 4, wherein the nucleation promotion layer is a sub-monolayer.

7. The method of claim 1, wherein the high-k dielectric layer is a compound material comprising a metal, and wherein the nucleation promotion layer comprises the metal, a silicide of the metal, or a silicate of the metal.

8. The method of claim 7, wherein the metal is hafnium.

9. The method of claim 7, wherein the nucleation promotion layer has a thickness of about 10 Å or less.

10. The method of claim 9, wherein the nucleation promotion layer is a monolayer or a sub-monolayer.

11. A method of fabricating a transistor gate structure, comprising:
    forming at least one intentional interface layer over a semiconductor body;
    forming a nucleation promotion layer over the intentional interface layer, the nucleation promotion layer comprising a metal, a metal silicide, or a metal silicate;
    forming a high-k dielectric layer over the nucleation promotion layer using a chemical vapor deposition process;
    forming a gate contact layer over the high-k dielectric layer; and
    patterning the gate contact layer and the high-k dielectric layer.

12. The method of claim 11, wherein forming the nucleation promotion layer and forming the high-k dielectric layer are performed in-situ in a single chemical vapor deposition process chamber.

13. The method of claim 11, wherein forming the nucleation promotion layer comprises performing one of a chemical vapor deposition process and a physical vapor deposition process.

14. The method of claim 11, wherein the nucleation promotion layer has a thickness of about 10 Å or less.

15. The method of claim 14, wherein the nucleation promotion layer is a monolayer.

16. The method of claim 14, wherein the nucleation promotion layer is a sub-monolayer.

17. The method of claim 11, wherein the high-k dielectric layer is a compound material comprising a metal, and wherein the nucleation promotion layer comprises the metal, a suicide of the metal, or a silicate of the metal.

18. The method of claim 17, wherein the metal is hafnium.

* * * * *